(12) United States Patent
Edelstein et al.

(10) Patent No.: US 9,299,765 B2
(45) Date of Patent: Mar. 29, 2016

(54) ALTERING CAPACITANCE OF MIM CAPACITOR HAVING REACTIVE LAYER THEREIN

(71) Applicant: GLOBALFOUNDRIES INC., Grand Cayman (KY)

(72) Inventors: Daniel C. Edelstein, White Plains, NY (US); Anthony K. Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/687,049

(22) Filed: Apr. 15, 2015

(65) Prior Publication Data
US 2015/0221717 A1    Aug. 6, 2015

Related U.S. Application Data

(62) Division of application No. 13/716,731, filed on Dec. 17, 2012, now Pat. No. 9,013,857.

(51) Int. Cl.
| H01G 5/00 | (2006.01) |
| H01L 49/02 | (2006.01) |
| H01G 7/02 | (2006.01) |
| H01G 7/04 | (2006.01) |
| H01G 7/06 | (2006.01) |

(52) U.S. Cl.
CPC .............. *H01L 28/75* (2013.01); *H01G 7/026* (2013.01); *H01G 7/04* (2013.01); *H01G 7/06* (2013.01); *H01L 28/40* (2013.01); *Y10T 29/417* (2015.01)

(58) Field of Classification Search
CPC .............. H01G 5/00; H01G 7/04; H01G 7/06

USPC .............. 361/303–305, 301.2, 301.4, 321.2; 438/240, 241, 253, 395, 396
See application file for complete search history.

(56) References Cited

U.S. PATENT DOCUMENTS

| 662,504 | A | 11/1900 | Schreck |
| 6,060,400 | A | 5/2000 | Oehrlein et al. |
| 6,215,644 | B1 | 4/2001 | Dhuler |
| 6,271,084 | B1 | 8/2001 | Tu et al. |
| 6,387,775 | B1 | 5/2002 | Jang et al. |
| 6,404,614 | B1 | 6/2002 | Zhu et al. |
| 6,461,914 | B1 * | 10/2002 | Roberts ............. H01L 21/76816 257/E21.008 |
| 6,625,004 | B1 | 9/2003 | Musolf et al. |
| 6,794,262 | B2 * | 9/2004 | Ning .................. H01L 23/5223 257/E21.009 |
| 6,821,839 | B2 | 11/2004 | Chung |
| 6,900,072 | B2 | 5/2005 | Patel et al. |

(Continued)

OTHER PUBLICATIONS

Ha, U.S. Appl. No. 12/858,953, Office Action Communication, May 23, 2012, 10 pages.

(Continued)

*Primary Examiner* — Nguyen T Ha
(74) *Attorney, Agent, or Firm* — Anthony Canale; Hoffman Warnick LLC

(57) ABSTRACT

Embodiments include a metal-insulator-metal (MIM) capacitor having: a first electrode; a second electrode disposed proximate the first electrode; an insulator layer between the first and second electrodes; and a reactive layer positioned proximate the insulator layer and configured to allow altering of the reactive layer to change a capacitive value of the MIM capacitor, the reactive layer including a reactive conductor.

8 Claims, 4 Drawing Sheets

(56) References Cited

U.S. PATENT DOCUMENTS

| | | |
|---|---|---|
| 6,940,117 B2 | 9/2005 | Coolbaugh et al. |
| 6,969,635 B2 | 11/2005 | Patel et al. |
| 6,995,034 B2 | 2/2006 | Patel et al. |
| 6,995,040 B2 | 2/2006 | Patel et al. |
| 7,138,984 B1 | 11/2006 | Miles |
| 7,146,419 B1 | 12/2006 | O'Rourke et al. |
| 7,164,199 B2 | 1/2007 | Tarn |
| 7,198,928 B2 | 4/2007 | Liang et al. |
| 7,286,278 B2 | 10/2007 | Patel et al. |
| 7,307,775 B2 | 12/2007 | Patel et al. |

OTHER PUBLICATIONS

Ha, U.S. Appl. No. 12/858,953, Notice of Allowance and Fees Due, Sep. 18, 2012, 12 pages.

Ha, U.S. Appl. No. 13/716,731, Office Action Communication, Sep. 25, 2014, 12 pages.

Ha, U.S. Appl. No. 13/716,731, Notice of Allowance, Dec. 15, 2014, 8 pages.

* cited by examiner

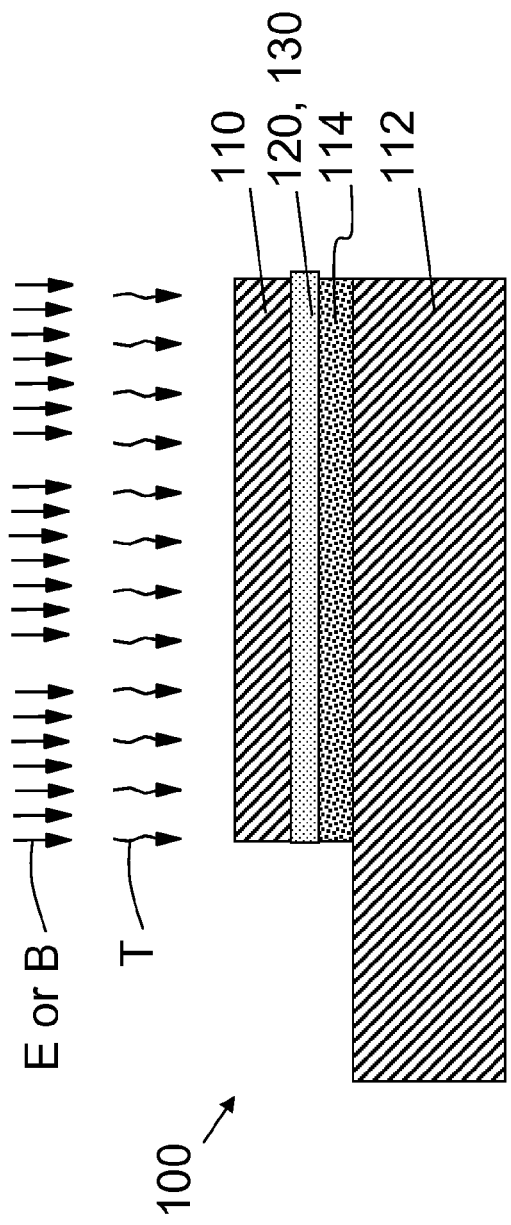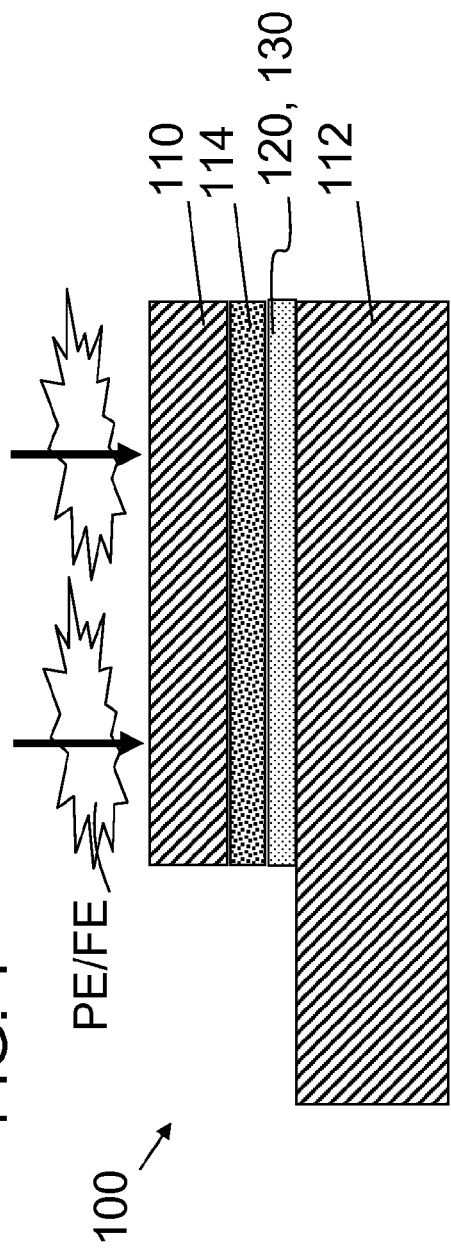

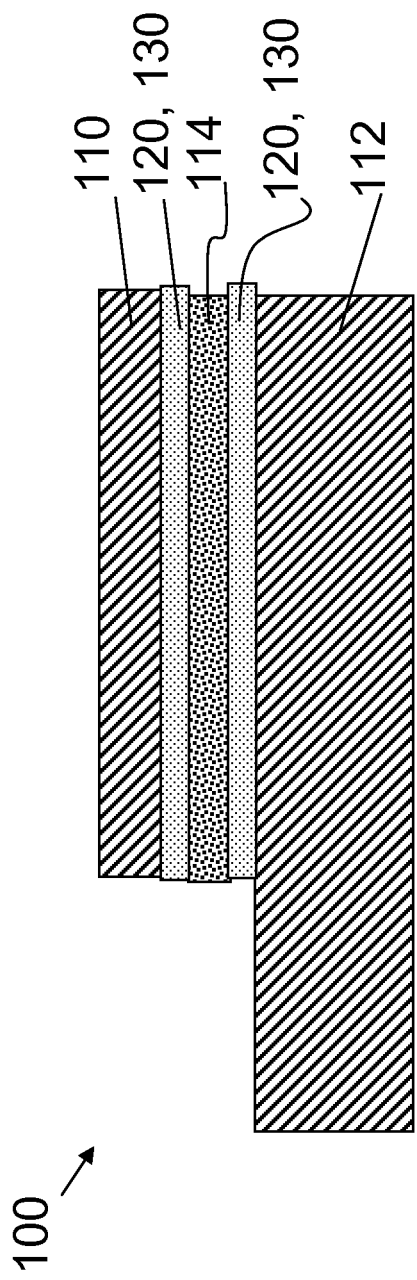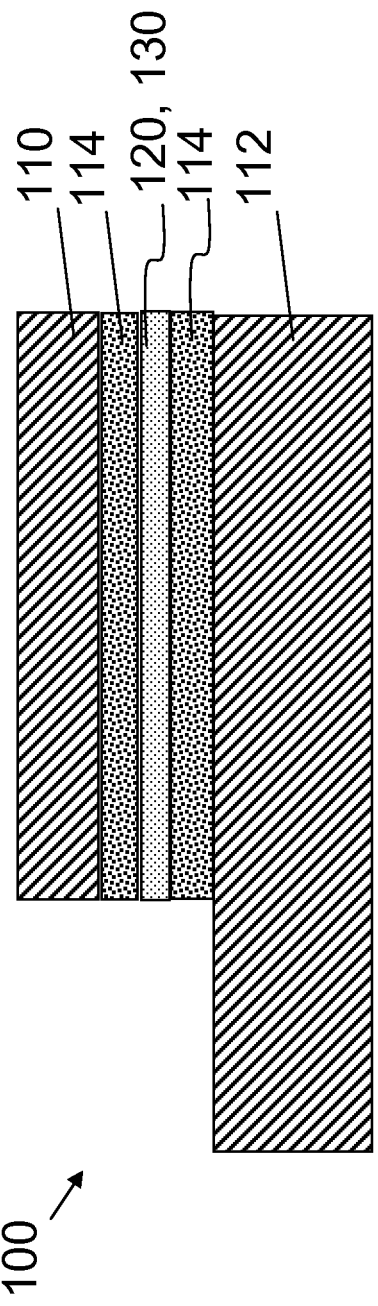

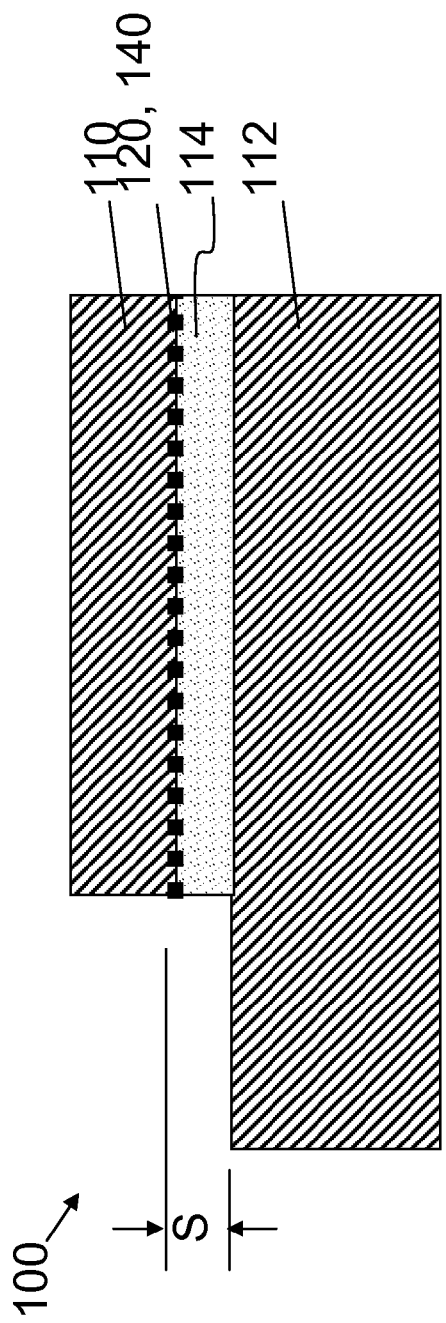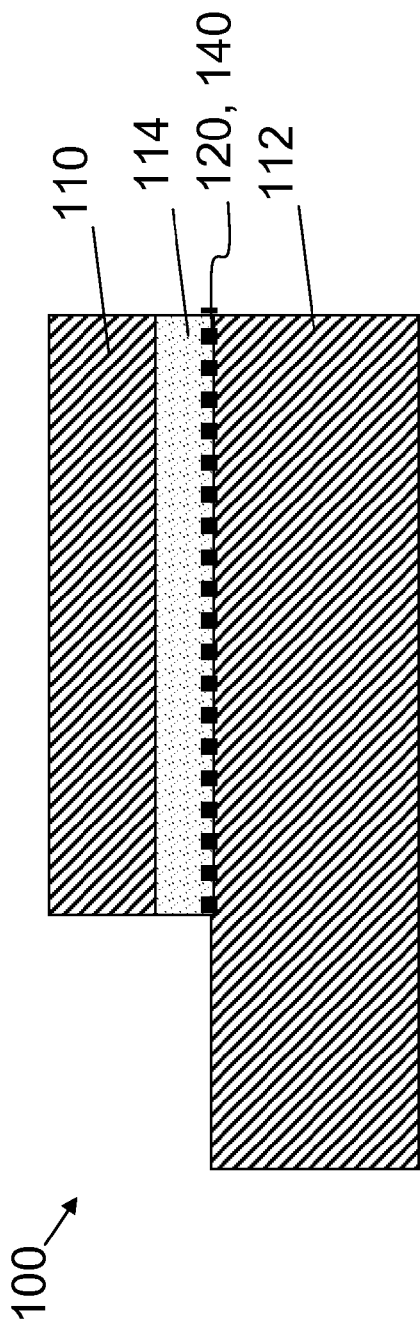

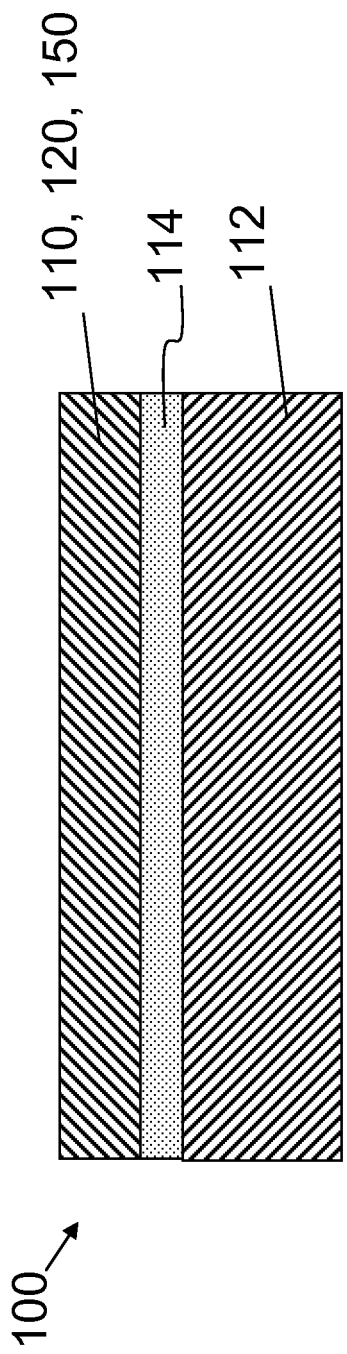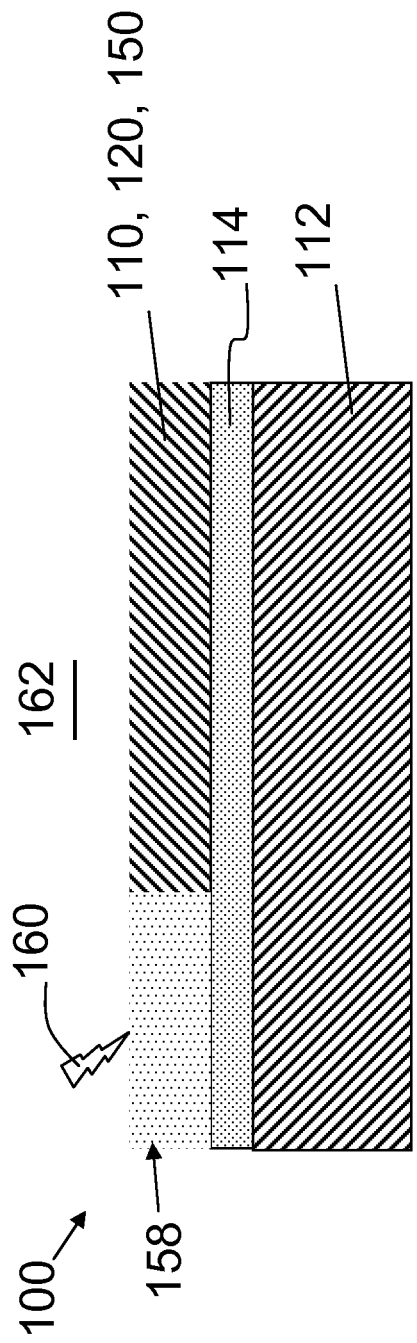

ALTERING CAPACITANCE OF MIM CAPACITOR HAVING REACTIVE LAYER THEREIN

CROSS-REFERENCE TO RELATED APPLICATIONS

This application is a divisional of U.S. patent application Ser. No. 13/716,731, filed Dec. 17, 2012, which is hereby incorporated by reference in its entirety.

BACKGROUND

1. Technical Field

The disclosure relates generally to metal-insulator-metal capacitors, and more particularly, to altering of a capacitive value of a MIM capacitor having a reactive layer therein.

2. Background Art

Passive elements such as metal-insulator-metal (MIM) capacitors, metal-insulator-semiconductor (MIS) capacitors or deep trench capacitors are widely used in integrated circuits for both digital and analog mixed signal technologies. For example, back-end-of-line (BEOL) MIM capacitors and front-end-of-line (FEOL) planar MIM or MIS or deep trench capacitors are commonly used. The critical integration factor for these passive elements is their capacitance value tolerances. For example, precision capacitors have tolerances of +/−10 to 15%.

Conventionally, passive element tolerance is controlled during fabrication by a number of approaches. One past approach includes trimming the capacitors to adjust their capacitance tolerance using, e.g., lasers or etching processes. Laser trimming of capacitors, however, is rarely practiced because it damages structure surrounding the capacitors, and creates yield issues. Another current approach includes using electronic fuses (e-fuses) to fuse in or out smaller capacitors that adjust the capacitance tolerance of the overall capacitor based on electrical test data. Unfortunately, trimming capacitors using e-fuses add what are effectively dangling radio frequency (rf) antennas, and also require the use of complicated e-fuse circuits. Furthermore, the space required for the e-fuses oftentimes results in wasted space due to the extra area required. For example, for a MIM capacitor requiring 100 picoFarads (pF), a 90 pF MIM would be placed with two additional 1 Opf MIMs, which could be wired in parallel to increase the capacitance. If one or both of these 10 pF capacitors were not needed (i.e., the intended-to-be 90 pF MIM actually resulted in the desired 100 pF MIM), then space occupied by the 10 pF capacitors and the associated e-fuses and circuitry are wasted.

BRIEF SUMMARY

A first aspect of the disclosure provides a method comprising: forming a metal-insulator-metal (MIM) capacitor including a first electrode and a second electrode and an insulator layer between the first and second electrodes, the MIM capacitor also including a reactive layer; and altering the reactive layer to change a capacitive value of the MIM capacitor.

A second aspect of the disclosure provides a metal-insulator-metal (MIM) capacitor comprising: a first electrode; a second electrode; an insulator layer between the first and second electrodes; and a reactive layer positioned to allow altering thereof to change a capacitive value of the MIM capacitor.

A third aspect of the disclosure provides a metal-insulator-metal (MIM) capacitor having: a first electrode; a second electrode disposed proximate the first electrode; an insulator layer between the first and second electrodes; and a reactive layer positioned proximate the insulator layer and configured to allow altering of the reactive layer to change a capacitive value of the MIM capacitor, the reactive layer including a reactive conductor.

A fourth aspect of the disclosure provides a metal-insulator-metal (MIM) capacitor having: a first electrode; a second electrode disposed proximate the first electrode; an insulator layer between the first and second electrodes; and a reactive layer positioned proximate the insulator layer and configured to allow altering of the first reactive layer to change a capacitive value of the MIM capacitor, the reactive layer including a conductor material of one of: the first electrode and the second electrode.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 1-8 show cross-sectional views of embodiments of MIM capacitor and related method according to the invention.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Referring to the drawings, as indicated above, the disclosure provides a metal-insulator-metal (MIM) capacitor 100 including a reactive layer 120. Altering of reactive layer 120, e.g., by an external field, changes the capacitance value of MIM capacitor 100. MIM capacitor 100 includes a first electrode 110, a second electrode 112 and an insulator layer 114 between the first and second electrodes. Insulator layer 114 may include any now known or later developed insulator appropriate for forming a MIM capacitor dielectric, e.g., silicon oxide, silicon nitride, silicon oxynitride, high-k material having a relative permittivity above about 10, or any combination of these materials. Examples of high-k material include but are not limited to metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$, where x, y, and z represent relative proportions, each greater than or equal to zero and $x+y+z=1$ (1 being the total relative mole quantity). In one embodiment, insulator layer 114 is created having a thickness and dielectric constant prior to any altering such that an initial capacitive value is within plus or minus three standard deviations (i.e., $+/-3\sigma$) of an intended or target capacitive value for MIM capacitor 100. In this manner, obtaining of the intended capacitive value is sufficiently achievable using the techniques described herein.

First electrode 110 and second electrode 112, except as otherwise described herein, may include one or more conductor materials, e.g., titanium nitride/aluminum copper/titanium nitride (TiN/AlCu/TiN), tungsten (W), titanium aluminum/aluminum copper/titanium aluminum/titanium nitride (TiAl$_3$/AlCu/TiAl$_3$/TiN), titanium nitride (TiN), tantalum nitride (TaN), copper/tantalum nitride (Cu/TaN), etc., as known in the art. Although shown as different sizes, first and second electrodes 110, 112 may be of similar or identical size. If MIM capacitor 100 is contacted from above using vias, then lower, second electrode 112 would be larger then upper, first electrode 110, to allow for vias contacting the lower electrode, as known in the art.

In contrast to conventional MIM capacitors, MIM capacitor 100 also includes reactive layer 120 positioned to allow altering thereof, e.g., using an external field, to change a capacitance value of the MIM capacitor. As will be described herein, reactive layer 120 may take a variety of different forms. As will also be described herein, various techniques are used for altering reactive layer 120 to change the capacitance value of MIM capacitor 100 depending on the type of reactive layer 120 used. MIM capacitor 100 may be formed using any now known or later developed techniques, e.g., material deposition, masking, patterning, etching, etc.

Referring to FIG. 1, in one embodiment, reactive layer 120 includes a tunable dielectric constant material 130. Collectively, insulator layer 114 and tunable dielectric constant material 130 constitute the "MIM dielectric". In this case, the altering includes creating a dipole moment change in reactive layer 120 to change a dielectric constant (k) of tunable dielectric constant material 130. If tunable dielectric constant material 130 increases its dielectric constant during tuning, then a total MIM dielectric thickness may be selected such that the capacitance is centered low to target, at or below the nominal −3σ. Alternatively, if tunable dielectric constant material 130 decreases its dielectric constant during tuning, then a total MIM dielectric thickness may be selected such that the capacitance is centered high to target, at or higher than the nominal +3σ. FIG. 1 shows tunable dielectric constant material 130 between insulator layer 114 and first electrode 110. Alternatively, as shown in FIG. 2, material 130 may be positioned between insulator layer 114 and second electrode 112. That is, as part of a bi-layer with insulator layer 114. It is also understood that material 130 could be, as shown in FIG. 3, between insulator layer 114 and first electrode 110 and between insulator layer 114 and second electrode 112. Alternatively, as shown in FIG. 4, material 130 could be sandwiched between insulator layers 114. That is, FIGS. 3 and 4 show material 130 as part of a tri-layer with insulator layer(s) 114.

Returning to FIG. 1, the dipole moment change may be created, for example, by exposing reactive layer 120 to an increased temperature (T) and either an electronic field (E) or a magnetic field (B). Temperature (T) may be raised using any now known or later developed heating process. Electronic field (E) and magnetic field (B) may also be created using any now known or later developed technique, e.g., an inductance coil for a magnetic field or by applying a voltage across plates such electrodes 110, 112 or external plates to MIM capacitor 100 in a known fashion for an electrical field. In this case, insulator layer 114 may include silicon oxide (SiO$_2$), and reactive layer 120 may include, for example, titanium (Ti). Here, increased temperature converts the Ti to titanium oxide (TiO$_2$), reducing a thickness of the SiO$_2$ of insulator layer 114. The result is a thicker MIM dielectric with increased spacing between electrodes 110, 112, and thus an increased capacitance value.

In another embodiment, shown in FIG. 2, the dipole moment change creating may include applying a stress by either pyro-electric or ferro-electric polarization transitioning (PE/FE) above or below a Curie temperature of the tunable dielectric constant material 130. In this case, tunable dielectric constant material 130 may include, for example: barium-tantalum-oxide (BaTiO$_3$), lead-titanium-oxide (PbTiO$_3$), and potassium-niobium-oxide (KNbO$_3$), which have Curie temperatures of approximately 120° C., 490° C. and 435° C., respectively. In any event, thermal/voltage stresses applied are significantly above use conditions. The stress converts material 130 to more conductive material, thus decreasing the capacitance value.

Referring to FIGS. 5 and 6, in another embodiment, reactive layer 120 includes a reactive conductor 140. As shown in FIG. 5, reactive conductor 140 may be positioned between first electrode 110 and insulator layer 114, or, as shown in FIG. 6, may be positioned between second electrode 112 and insulator layer 114. In this case, the altering includes stressing reactive layer 120 to cause reacting and/or diffusing of reactive conductor 140 with insulator layer 114 to change the dielectric constant or a spacing (S) (FIG. 5 only) between first and second electrodes 110, 112. In particular, in one embodiment, the stressing may include either thermal stressing (thermally oxidizing) or thermal and electrical stressing to cause an interfacial reaction between one of first and second electrodes 110, 112 and insulator layer 114. The stressing changes the spacing (S) (FIG. 5 only) between first and second electrodes 110, 112. In this way, either insulator layer 114 is made thicker, typically increasing capacitance value of MIM capacitor 100, or insulator layer 114 is made thinner, typically decreasing the capacitance value of MIM capacitor 100. It is emphasized, however, as will be described herein, that either of the cases described above do not necessarily result in the typical or expected increase or decrease in capacitance value.

In one embodiment, insulator layer 114 is consumed by first or second electrode 110, 112 by reaction of insulator layer 114 and the conductor material of the first or second electrode 110, 112. For example, if second electrode 112 or insulator layer 114 were titanium (Ti) and the wafer was exposed to an elevated temperature oxygen anneal at, for example, 400° C., then the Ti thickness would decrease as the Ti in contact with insulator layer 114 was converted to titanium oxide, resulting in an increase in the capacitor dielectric thickness and lower capacitance.

In another embodiment, insulator layer 114 is consumed by first or second electrode 110, 112 by diffusion of conductor material from first or second electrode 110, 112 into insulator layer 114 to cause it to change. For example, reactive conductor 140 may include: aluminum (Al), titanium (Ti) and/or tantalum (Ta), and insulator layer 114 may include silicon oxide (SiO$_2$) in contact with the reactive conductor. In this case, heating will decrease the capacitance value by converting some of first or second electrode 110, 112 to metal oxide (e.g., Al$_2$O$_3$, TiO$_2$, or Ta$_2$O$_5$, respectively) as it chemically reduces SiO$_2$ of insulator layer 114 at sufficient temperature. MIM dielectric thickness is effectively increased and the capacitance value of MIM capacitor 100 decreases. This atypical decrease in capacitance value occurs despite thicker MIM dielectric (by adding of a higher-k material) because that region is still lower in capacitance than if occupied by the metal of electrodes 110, 112.

The above-described oxidation methods could also be applied to silicon-insulator-silicon and silicon-insulator-metal capacitors. For example, the silicon could be oxidized in a high temperature oxidizing anneal, resulting in greater capacitor dielectric thickness and reduced capacitance.

In another embodiment, the altering includes heating and applying a voltage of a given polarity and magnitude to cause ingress by diffusion and drift of conductor material of at least one of first and second electrodes 110, 112 into insulator layer 114.

Referring to FIG. 7, in another embodiment, reactive layer 120 includes a portion of the first or the second electrode 110, 112 that is in contact with insulator layer 114 (all of it in FIG. 7), and the altering includes performing a thermal oxidization to convert the reactive layer to a dielectric. In one embodiment, the thermal oxidation may be performed at approximately 400° C. In this case, reactive layer 120 includes a conductor material 150 such as: aluminum (Al), silicon (Si), titanium (Ti) and/or tantalum (Ta). In this embodiment, MIM capacitor 100 area is centered high to target, at or above the nominal +3σ point. The thermal oxidation converts the portion of the stated conductor materials to $Al_2O_3$, $SiO_2$, $TiO_2$, or $Ta_2O_5$, respectively.

As shown in FIG. 8, in another embodiment, the altering may include exposing a portion 158 of reactive layer 120 to a laser 160 in an oxidizing ambient 162 to convert the portion of the conductor material 150 in contact with insulating layer 114 to a dielectric to reduce an area of MIM capacitor 100. Oxidizing ambient 162 may include, for example: oxygen ($O_2$), ozone ($O_3$), nitrogen oxide ($N_2O$), carbon dioxide ($CO_2$) and/or carbon monoxide (CO). The oxidizing ambient temperature may be, for example, approximately 400° C. Here, conductor material 150 may include, for example: aluminum (Al), silicon (Si), titanium (Ti) and/or tantalum (Ta). The laser-heating converts portion 158 of the stated conductor materials to $Al_2O_3$, $SiO_2$, $TiO_2$, or $Ta_2O_5$, respectively, in any of the above listed ambients. MIM capacitor 100 has a reduced capacitance value in this case.

In view of the foregoing, it is understood that an "external field" can take a variety of forms such as, but not limited to: heating, application of an electrical field, application of a magnetic field, application of a laser, pyro-electric techniques or ferro-electric techniques.

In one embodiment of a method according to the invention, MIM capacitor 100, as described herein, is formed using any now known or later developed techniques. As described, MIM capacitor 100 includes first electrode 110 and second electrode 112 and insulator layer 114 between the first and second electrodes. MIM capacitor 100, in contrast to conventional MIM capacitors, also includes reactive layer 120. Reactive layer 120 may include: a tunable dielectric constant material 130 between the first and second electrodes; a reactive conductor 140 between the first and second electrodes; or a conductor material 150 of the first and second electrodes. After formation, a capacitive value of MIM capacitor 100 can be measured, using any now known or later developed technique. If the capacitance value is not that intended, reactive layer 102 may be altered, e.g., using an external field, as described herein, to change a capacitive value of the MIM capacitor. The methods discussed above provide for uniform capacitance tuning within wafer, i.e., if the median capacitance value of a wafer was 6% off target, then it would be tuned by 6%. It is also envisioned that within wafer tuning could be accomplished, by varying the electrical or magnetic field intensity across a wafer, based on electrical test data, or by varying the temperature across the wafer during electrical or magnetic field tuning, or both.

The methods and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from cell phones, toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A metal-insulator-metal (MIM) capacitor comprising:
a first electrode;
a second electrode disposed proximate the first electrode;
an insulator layer between the first and second electrodes; and
a reactive layer positioned proximate the insulator layer between the first and second electrodes and configured to allow altering of the reactive layer to change a capacitive value of the MIM capacitor, the reactive layer including a reactive conductor wherein the reactive layer includes silicon dioxide ($SiO_2$) in contact with the reactive conductor.

2. The MIM capacitor of claim 1, wherein the reactive layer is positioned between the insulator layer and the first electrode.

3. The MIM capacitor of claim 1, wherein the reactive layer is positioned between the insulator layer and the second electrode.

4. The MIM capacitor of claim 1, wherein the reactive conductor is selected from the group comprising: aluminum (Al), titanium (Ti) and tantalum (Ta).

5. A metal-insulator-metal (MIM) capacitor comprising:
a first electrode;
a second electrode disposed proximate the first electrode;
an insulator layer between the first and second electrodes; and
a reactive layer positioned proximate the insulator layer between the first and second electrodes and configured to allow altering of the first reactive layer to change a capacitive value of the MIM capacitor, the reactive layer including a conductor material of one of: the first electrode and the second electrode wherein the reactive layer includes silicon dioxide ($SiO_2$) in contact with the reactive conductor.

6. The MIM capacitor of claim 5, wherein the reactive layer includes a portion of the first electrode that is contact with the insulator layer.

7. The MIM capacitor of claim 5, wherein the reactive layer includes a portion of the second electrode that is contact with the insulator layer.

8. The MIM capacitor of claim 5, wherein the reactive layer is selected from the group comprising: aluminum (Al), silicon (Si), titanium (Ti) and tantalum (Ta).

* * * * *